(12) United States Patent
Sahinoglu et al.

(10) Patent No.: US 9,244,129 B2
(45) Date of Patent: Jan. 26, 2016

(54) METHOD FOR ESTIMATING A STATE OF CHARGE OF BATTERIES

(71) Applicant: Mitsubishi Electric Research Laboratories, Inc., Cambridge, MA (US)

(72) Inventors: Zafer Sahinoglu, Cambridge, MA (US); Huazhen Fang, La Jolla, CA (US); Yebin Wang, Acton, MA (US)

(73) Assignee: Mitsubishi Electronic Research Laboratories, Inc., Cambridge, MA (US)

( * ) Notice: Subject to any disclaimer, the term of this patent is extended or adjusted under 35 U.S.C. 154(b) by 194 days.

(21) Appl. No.: 14/147,777

(22) Filed: Jan. 6, 2014

(65) Prior Publication Data

US 2014/0214348 A1    Jul. 31, 2014

Related U.S. Application Data

(63) Continuation-in-part of application No. 13/752,666, filed on Jan. 29, 2013, now Pat. No. 9,077,182.

(51) Int. Cl.
  *H02J 7/00*     (2006.01)
  *G01R 31/36*    (2006.01)
  *G01N 27/416*   (2006.01)

(52) U.S. Cl.
  CPC ........ *G01R 31/3651* (2013.01); *G01R 31/3624* (2013.01); *G01R 31/3648* (2013.01)

(58) Field of Classification Search
  CPC ........... G01R 31/3648; G01R 31/3651; G01R 31/3679
  USPC .............................. 320/132; 324/427; 702/63
  See application file for complete search history.

(56) References Cited

U.S. PATENT DOCUMENTS

| | | | | |
|---|---|---|---|---|
| 6,285,163 | B1* | 9/2001 | Watanabe | G01R 31/3662 320/132 |
| 6,534,954 | B1* | 3/2003 | Plett | H01M 10/48 320/132 |
| 7,486,079 | B2* | 2/2009 | Yumoto | G01R 31/3624 320/132 |
| 7,710,119 | B2* | 5/2010 | Bertness | G01R 31/3624 320/132 |
| 7,830,119 | B2* | 11/2010 | Naik | G01R 31/3648 320/132 |
| 8,008,891 | B2* | 8/2011 | Yun | B60L 11/1861 320/132 |
| 8,626,679 | B2* | 1/2014 | Cho | B60L 3/0046 320/132 |
| 8,655,612 | B2* | 2/2014 | Itabashi | G01R 31/3651 320/106 |
| 8,994,331 | B2* | 3/2015 | Kerfoot, Jr. | H01M 10/44 320/107 |
| 9,077,182 | B2* | 7/2015 | Wang | G01R 31/3651 |
| 2009/0058367 | A1* | 3/2009 | Naik | H01M 10/48 320/136 |
| 2013/0116954 | A1* | 5/2013 | Tazoe | G01R 31/3624 702/63 |
| 2015/0046108 | A1* | 2/2015 | Akamine | H01M 10/48 702/63 |

* cited by examiner

*Primary Examiner* — M'Baye Diao
(74) *Attorney, Agent, or Firm* — Dirk Brinkman; Gene Vinokur

(57) ABSTRACT

A method estimates a state-of-charge (SoC) of a battery by constructing a set of two or more battery models. Each battery model is associated with an adaptive SOC estimator. A set of intermediate SOCs is estimated using the models and the associate adaptive SoC estimators. Then, the set of intermediate SoCs are fused to obtain a final SoC of the battery.

17 Claims, 2 Drawing Sheets

METHOD FOR ESTIMATING A STATE OF CHARGE OF BATTERIES

RELATED APPLICATION

This Application is a Continuation-in-Part of U.S. patent application Ser. No. 13/752,666, "Method for Estimating State of Charge for Lithium-ion Batteries," filed by Wang, Jan. 29, 2013, incorporated herein by reference. The related Application is an adaptive approach for SoC estimation using a single battery model.

FIELD OF THE INVENTION

This invention relates in general to rechargeable batteries, and in more particular to state-of-charge estimation of batteries with Lithium-ion chemistries.

BACKGROUND OF THE INVENTION

Many power applications require a well-designed battery management system (BMS) for operational safety and performance. The BMS monitors a current status of a battery, and regulates charging and discharging processes. One fundamental function is to estimate a state-of-charge (SoC) of the battery, i.e., a ratio of the current battery capacity over the maximal capacity.

In SoC estimation, one notable trend is an increasing emphasis on model-based estimation methods. While battery modeling is well known, more attention is being directed to the development of estimation methods.

Because a good model is a prerequisite, model-based SoC estimation typically uses dynamic modeling and parameter identification. However, accurate identification is difficult for the following reasons. The parameters for a battery model change over time and with varying operational conditions. The internal resistance increases and the capacity decreases as a result of battery aging. The charging and discharging efficiencies are dependent on the SoC and the current and temperature. The parameters can differ from one battery to another, making identification for each battery difficult. Therefore, adaptive methods are preferred. Adaptive methods perform identification and SoC estimation jointly.

As shown in FIG. 1, an adaptive SoC estimator provides the SoC 140 and estimates of the model parameters in real time after assimilating the current-voltage data on the basis of a model 110. The parameter estimates 111 are used to update the model to assist the estimation 120. A battery 100 is connected to a voltage sensor 102, a current sensor 102, and a temperature sensor 103. The parameter estimation unit 120 can, for example, use a UD-recursive least square (RLS) to estimate parameters for the model based on an battery equivalent circuit model 121.

One adaptive Extended Kalman Filter (EKF) based SoC estimator interacts with a parameter estimator. In another method, state augmentation is performed to incorporate the SoC variable and model parameters, and then an unscented Kalman Filter (UKF) is applied to estimate an augmented state. However, the convergence, and as a result, the accuracy, are difficult to guarantee. In another method, an adaptive SoC estimator is developed using an Iterative Extended Kalman Filter (IEKF), guided by an analysis of the observability and identifiability. An adaptive Partial Differential Equations (PDE) observer for SoC estimation is also known. It should be noted that all conventional methods are based on a single battery model.

The related Application uses an adaptive approach for SoC estimation via IEKF based simultaneous state and parameter estimation. While credible estimation is obtained, the accuracy can still limited due to a mismatch between the model and the actual system.

SUMMARY OF THE INVENTION

The embodiments of the invention provide a method for monitoring conditions of a rechargeable battery to determine a state of charge of the battery. The method seamlessly links multiple models and thus multiple adaptive SoC estimations. Compared to a single model, multiple models can provide a better description of complicated uncertain dynamics, and are particularly suitable to deal with the tasks relevant to batteries.

An overview of the construction of a multimodel adaptive SoC (MM-AdaSoC) estimator according to embodiments of the invention is as follows. First, multiple models are constructed from a modified Nernst battery model by fixing some parameters and assuming that other parameters are unknown. Each model is shown to be locally observable with admissible inputs by rigorous analysis.

Then, an adaptive SoC estimation scheme is implemented concurrently but independently to each model, with the model in each implementation assumed to be true. The intermediate SoC estimates resulting from the different models are fused in the light of a certain strategy to obtain a final estimate. As such, the accuracy of SoC estimation is increased despite the presence of uncertainties in the battery models.

The MM-AdaSoC method provides a robust SoC estimation while maintaining a good balance over the computational cost.

DETAILED DESCRIPTION OF THE PREFERRED EMBODIMENTS

Figure 1:
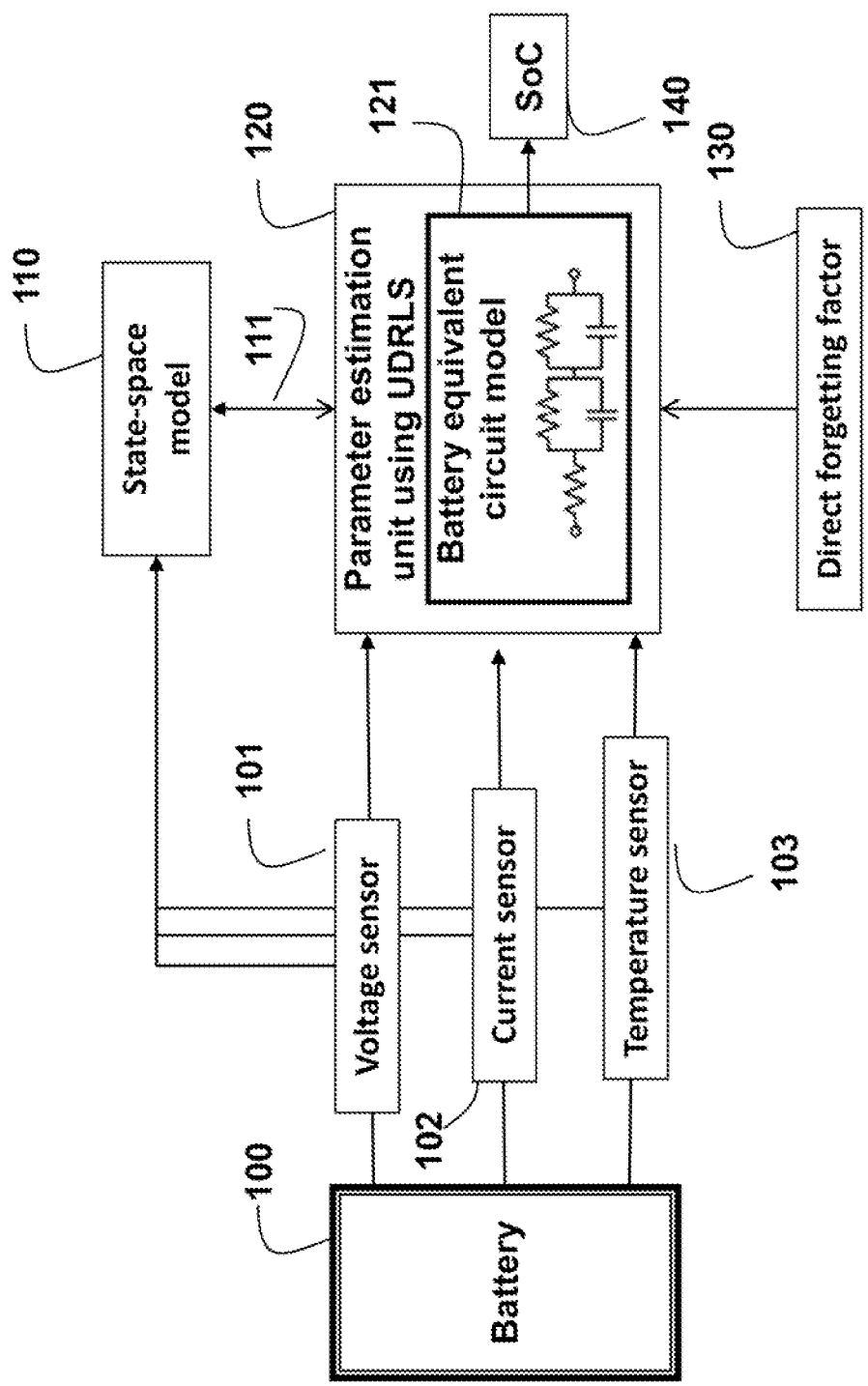
FIG. 1 is a block diagram of a conventional adaptive battery state-of-charge estimator using a single model.
Figure 2:
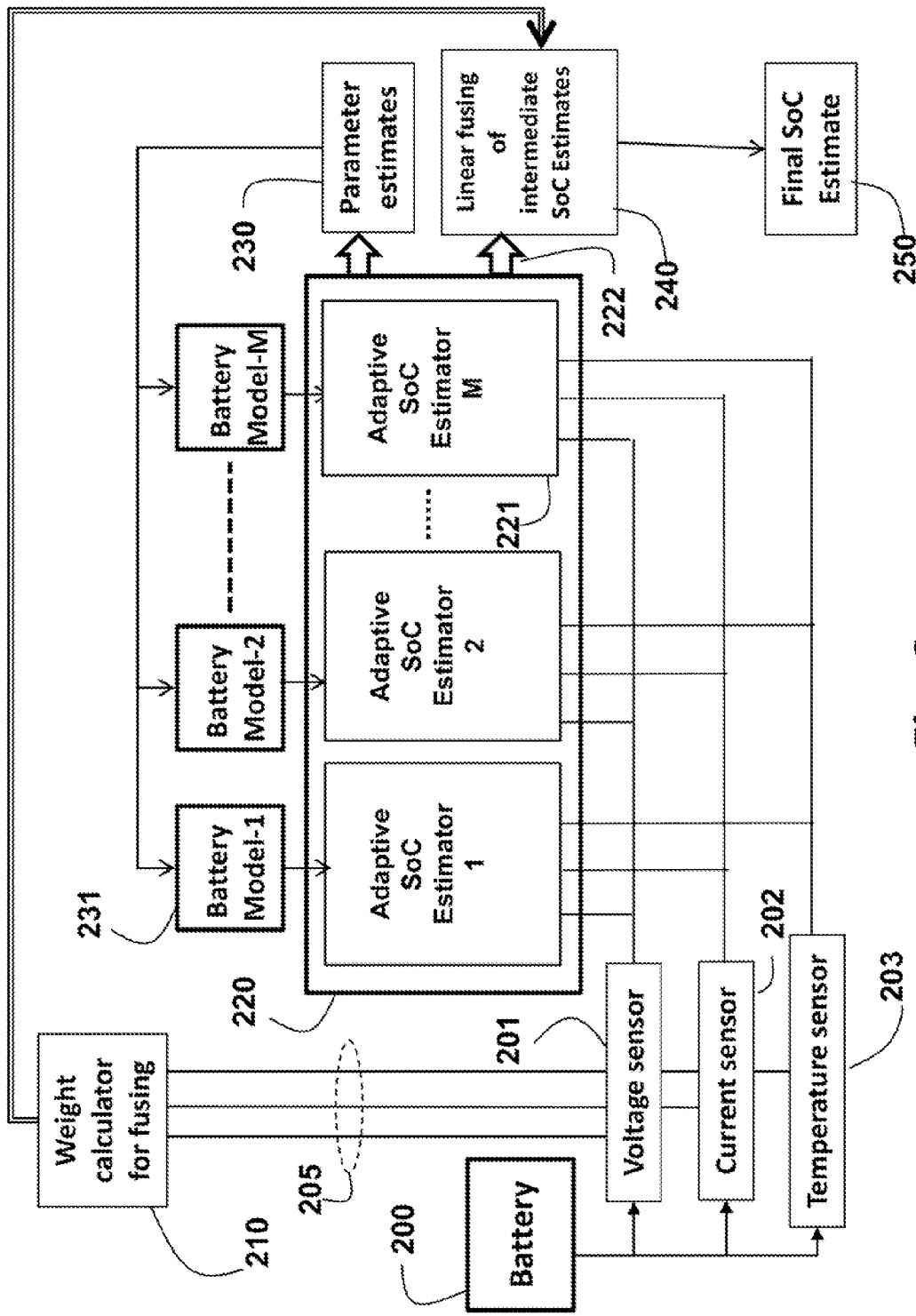
FIG. 2 is a block diagram of a multi-model adaptive battery state-of-charge estimator using multiple models according to embodiments of the invention.

FIG. 2 shows a structure of a multimodel adaptive SoC (MM-AdaSoC) system according to embodiments of the invention. A battery 200 is connected to a voltage sensor 102, a current sensor 102, and a temperature sensor 103. The battery can operates according to lithium-ion chemistries, although it is understood that the invention can be used with other types of rechargeable batteries.

A weight calculator 210 is used for weighting of output of the sensors 201-203 that are used to fuse 240 intermediate SoC estimates. The estimator 220 includes a set of two or more (multiple) adaptive estimators 221, 1, . . . , M. There is a corresponding battery model 231 for each adaptive estimator. The estimator 220 determines parameters 230 for the models 231. The intermediate SoC estimates that are output by the adaptive estimators 221 are fused 240 to obtain a final estimate of the SoC 250.

Each parallel state-of-charge estimator 221 is based on different models 231. Each estimator uses the sensor data and the corresponding model 231 to produce an independent intermediate estimate. All the estimates are then fused 240 to obtain the final estimate 250. Many options exist for the SoC estimators 231, such as a Kalman filter (KF) for a linear model, or an extended KF for a nonlinear model. Of particular interest is the strategy for the fusing 240.

The method can be implemented in a processor connected to memory and input/output interfaces by buses as known in the art.

Let us consider a general battery system. An unknown SoC of the battery at time k is denoted by $x_k$. Actual measurement of the battery obtained by the sensors 201-203 are $z_k$. Different models are available to describe the battery system, leading to a model set $M=\{M_1, M_2, \ldots, M_N\}$. Assuming that the true system coincides with one model at each time instant, we do not know which model matches the system at any particular time. Thus, a probabilistic description is used. Let $s_k$ denote a current status at time k. It may take any model $M_i$ for $i=1, 2, \ldots, N$ to address an uncertainty of model matching.

The probability of being in state $s_k$ for the model $M_i$ is denoted as $p(s^i_k)$. In other words, $p(s^i_k)$ indicates an a priori probability that the true model is $M_i$ at time k, such that the sum of the probabilities is $$\sum_{i=1}^{N} p(s_k^i) = 1.$$

From a statistical perspective, $x_k$ and $z_k$ are continuous random variables and $s_k$ a discrete variable. For simplicity and convenience, we use the symbol p to denote a probability density function (pdf) or a probability mass function (pmf), or mixed pdf-pmf.

We define the measurements as $\mathbb{Z}_k$ or $Z_k=\{z_1, z_2, \ldots, z_N\}$, and estimate the SoC $x_k$ from $Z_k$, hence considering the conditional probability $p(x_k|Z_k)$, $$p(x_k, \mathbb{Z}_k) = \sum_{i=1}^{N} p(x_k, s_k^i \mid \mathbb{Z}_k) \quad (1)$$

$$= \sum_{i=1}^{N} p(x_k \mid s_k^i, \mathbb{Z}_k) p(s_k^i \mid \mathbb{Z}_k).$$

When $p(x_k|Z_k)$ is available, we perform either a minimum-mean-square-error (MMSE) estimation, or a maximum a posteriori (MAP) estimation of $x_k$. Independent of the method (MMSE or MAP) used, it follows from equation (1) that $$\hat{x}_{(k|k)} = \sum_{i=1}^{N} \hat{x}_{(k|k)}^i p(s_k^i, Z_k), \quad (2)$$

where $\hat{x}_{(k|k)}^i$ is the estimate of $x_k$ based on the model $M_i$. Analytically, when the mode(s) of the posterior distribution can be given in closed form. The MAP can be obtained using an expectation-maximization procedure.

If we define $\mu_k^i = p(s)_k^i|Zk$ and $w_k^i = p(z_k|s_k^i, Z_{k-1})$, then the weights $\mu_k^i$ are given by the ratio $$\mu_k^i = \frac{w_k^i p(s_k^i)}{\sum_{j=1}^{N} w_k^j p(s_k^j)}. \quad (3)$$

Hence, by equations (2-3), the fusing strategy according to the invention is $$\hat{x}_{k|k} = \sum_{i=1}^{N} \hat{x}_{k|k}^i \mu_k^i. \quad (4)$$

The fused final estimate is a linear weighted combination of the intermediate SoCs from adaptive estimators.

It is noted that the estimation is based on a series of elemental filters and the fusing. The process is similar to a weight-based reconciliation, which balances the role that the different models potentially have during the estimation. The residuals of the elemental filter based on the 'correct' model, which best matches the true system, is expected to be remarkably smaller than those of the others. As a result, a probabilistic weight associated to the particular adaptive estimator tends to increase, and reduce for other estimators. The fused estimate approaches the estimate based on the correct model.

The underlying idea of the MM-AdaSoC method according to the invention is that the IEKF-based adaptive SoC estimation with different settings is performed for multiple models, and the intermediate estimates are fused to yield the final SoC estimate.

For the MM-AdaSoC, the recursive and real-time implementation reduces the amount of stored data, and increases the accuracy of the estimation because the update procedure relies on iterative searching at each recursion. Another noteworthy advantage is that a good balance is maintained between the estimation performance and the computational complexity, conceding a generally linear moderate increase of the demanded computing power depending on the number of models used.

The MM-AdaSoC method can be applied to different types of batteries. Due to its parameterized characterization, the Nernst model has been found capable of describing the dynamics of many batteries, e.g., nickel metal hydride (NiMH), LiMn2O4 and LiCoO2. As a result, the MM-AdaSoC method can be applied to such batteries for SoC estimation based on the Nernst model.

In addition to the MM-AdaSoC method, the role that multi-model estimation can play is more profound. It can be developed as a framework, within which a variety of advanced estimation methods can be constructed for battery applications.

We identify five potential sources of multiple models:

a. a set of submodels established from a battery model by fixing certain parameters for adaptive SoC estimation;

b. a set of submodels established from a model by assuming different sets of values for model parameters;

c. a set of different models constructed in different ways, such as an equivalent-circuit model and an electrochemical-principles-based model;

d. a set of models capturing different characteristics of batteries, e.g., the charging and discharging processes, cycling and aging effects; and e. a multitude of (sub)models combining the above example sources.

The multi-model has the following benefits. It better captures battery dynamics, which are known to be complex and multi-faceted, thus providing accurate SoC estimation. It reduces the complexity of the estimator design, especially when highly nonlinear battery dynamics are involved, in a 'divide-and-conquer' manner. Simple and elegant solutions can be achieved, and theoretical analysis is made easier. It can even provide a useful model interpretation and comparison in some circumstances.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for estimating a state-of-charge (SoC) of a battery, comprising the steps of:
   constructing a set of two or more battery models, wherein each battery model is associated with an adaptive SoC estimator;
   estimating a set of intermediate SoCs using the models and the associate adaptive SoC estimators; and
   fusing the set of intermediate SoCs to obtain a final SoC of the battery, wherein the method is performed in a processor.

2. The method of claim 1, further comprising:
   measuring conditions of the battery; and
   determining weights for the conditions; and
   fusing the set of intermediate SoCs according to the weights.

3. The method of claim 2, wherein the conditions include voltages, currents and temperatures of the battery.

4. The method, of claim 1, wherein the battery, is one of: a lithium (Li) ion, a nickel metal hydride (NiMH), a $LiMn_2O_4$ and $LiCoO_2$ battery.

5. The method of claim 1, wherein each SoC estimators determines parameters for the associated model.

6. The method of claim 1, wherein the adaptive SoC estimator is a Kalman filter (KF) for a linear model, or an extended KF for a nonlinear model.

7. The method of claim 2, wherein $M=\{M_1, M_2, \ldots, M_N\}$ denotes the set of models, an unknown SoC of the battery at time k is $x_k$, measurement of the conditions are $z_k$, and $s_k$ denotes a current status, and a probability of the state $s_k$ for model $M_i$ is denoted as $p(s^i_k)$, which indicates an a priori probability that a true model is $M_i$ at time k, such that a sum of the probabilities is $$\sum_{i=1}^{N} p(s^i_k) = 1.$$

8. The method of claim 7, wherein $x_k$ and $z_k$ are continuous random variables and $s_k$ is a discrete variable.

9. The method of claim 7, further comprising:
   performing a minimum-mean-square-error (MMSE) estimation or maximum a posteriori (MAP) estimation of $x_k$.

10. The method of claim 7, wherein $\mu_k^i = p(s)_k^i | Z_k$ and $w_k^i = p(z_k | s_k^i, Z_k)$, and weights $\mu_k^i$ are $$\mu_k^i = \frac{w_k^i p(s_k^i)}{\sum_{j=1}^{N} w_k^j p(s_k^j)}.$$

11. The method of claim 10, wherein the fusing is according to $$\hat{x}_{k|k} = \sum_{i=1}^{N} \hat{x}_{k|k}^i \mu_k^i,$$

where $\hat{x}_{(k|k)}^i$ is an estimate of $x_k$ based on the model $M_i$.

12. The method of claim 1, wherein the fusing is a linear weighted combination of the intermediate SoCs.

13. The method of claim 1, wherein the models include a set of submodels that fix parameters of the adaptive SoC estimator.

14. The method of claim 1, wherein the models include a set of submodels by assuming different sets of values for parameters of the models.

15. The method of claim 1, wherein the models include an equivalent-circuit model.

16. The method of claim 1, wherein the models include an electrochemical-principles-based model.

17. The method of claim 1, wherein the models capture different characteristics of batteries, including charging and discharging processes, cycling and aging effects, or combinations thereof.

* * * * *